United States Patent
Yoon (10) Patent No.: US 7,057,441 B2
(45) Date of Patent: Jun. 6, 2006

(54) BLOCK SELECTION CIRCUIT

(75) Inventor: Sang Sic Yoon, Icheon-Shi (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 35 days.

(21) Appl. No.: 10/876,906

(22) Filed: Jun. 25, 2004

(65) Prior Publication Data

US 2005/0231264 A1 Oct. 20, 2005

(30) Foreign Application Priority Data

Apr. 20, 2004 (KR) .................. 10-2004-0027099

(51) Int. Cl.
*G06F 11/16* (2006.01)
(52) U.S. Cl. .................. 327/526; 327/525; 365/225.7
(58) Field of Classification Search .............. 327/525, 327/526; 365/225.7
See application file for complete search history.

(56) References Cited

U.S. PATENT DOCUMENTS 6,865,123 B1 * 3/2005 Lee .................. 365/200

* cited by examiner

*Primary Examiner*—Kenneth B. Wells
(74) *Attorney, Agent, or Firm*—Marshall, Gerstein & Borun LLP (57) ABSTRACT

Provided is directed to a block selection circuit, comprising a reference fuse block by copying fuse blocks to output a reference signal later than or at the same time to decision signals which are outputted from fuse blocks which distinguish whether an external address is a repair address or not according to fuse cutting states and an external address, capable of improving speed of the block selection circuit by removing delay units by means of generating a spare row enable signal later than decision signals using the reference signal, and available to assure stability of an operation because the reference fuse block is similarly changeable, although outputting speeds of decision signals from fuse blocks are variable according to a process, a temperature, a driving voltage, and so on.

11 Claims, 12 Drawing Sheets

BLOCK SELECTION CIRCUIT

This application relies for priority upon Korean Patent Application No. 2004-0027099 filed on Apr. 20, 2004, the contents of which are herein incorporated by reference in their entirety.

BACKGROUND

1. Field of the Invention

The present invention relates to a block selection circuit, and more particularly, to a block selection circuit capable of improving speed of the block selection, and improving convenience of a simulation, as a reference fuse block is comprised to output a reference signal later than or at the same time to decision signals outputted from fuse blocks and a spare row enable signal is generated later than the decision signals by using the reference signal, in order to remove delay components.

2. Discussion of Related Art

Figure 1:
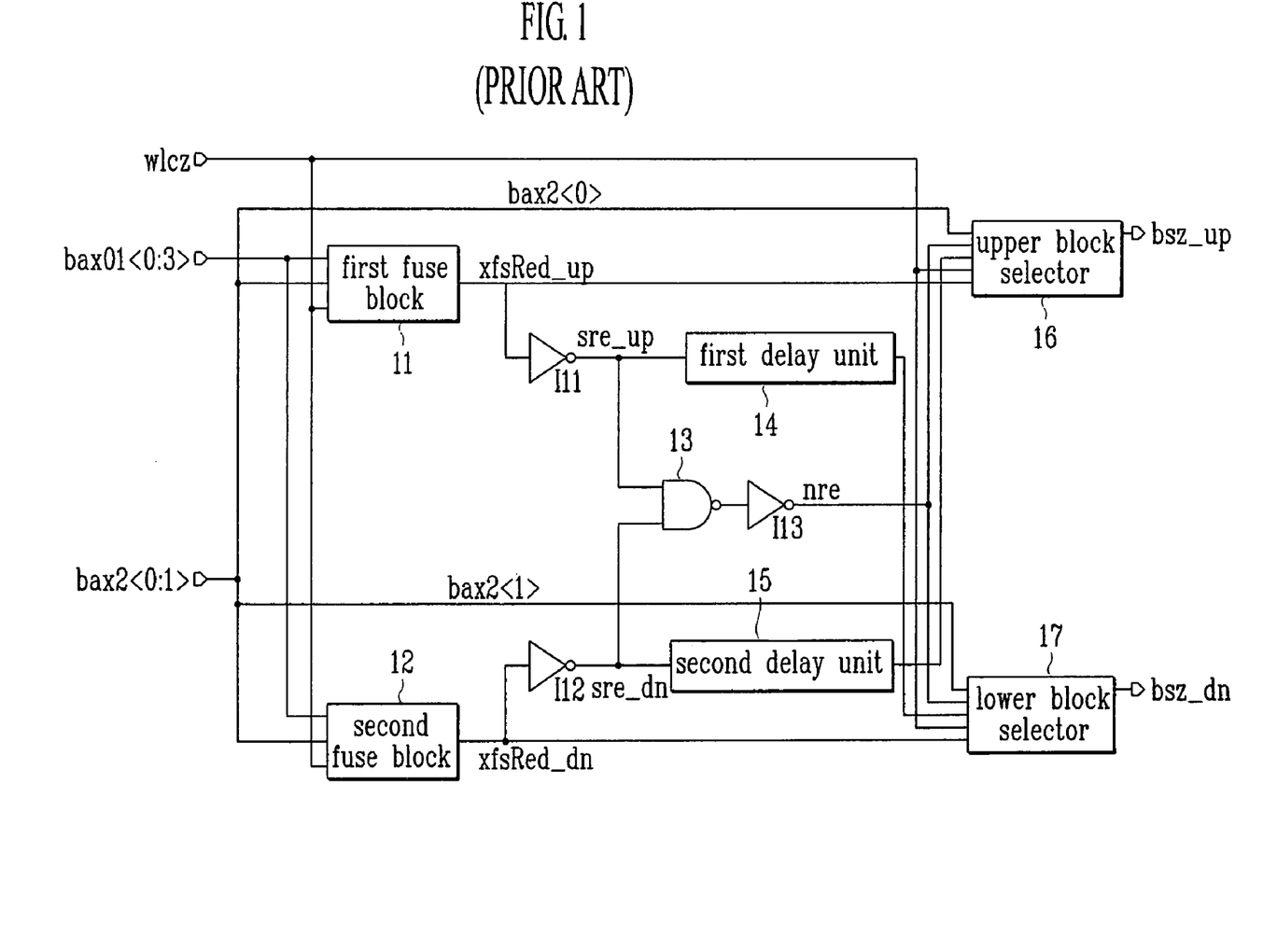
FIG. 1 is a circuit diagram of a conventional block selection circuit.

A memory selects one block of a plurality of blocks comprised of thousands of word lines by using higher bit of row address and a specific word line of thousand of word lines in the block by using lower bit of row address. In addition, redundancy word lines replace defective word lines which occur fail, and a repair information is stored in the memory according to a fuse cutting. Accordingly, a block selection circuit selects a block in accordance with a block information determined by an external address. And also the circuit selects a block by whether the external address corresponds to the word lines replaced with the redundancy word lines, which means fuse cutting states. FIG. 1 is a circuit diagram illustrating the conventional block selection circuit.

Referring to FIG. 1, each of a first fuse block 11 and a second fuse block 12 includes a plurality of fuses and stores information of repair address according to fuse cutting states. Further, the first fuse block 11 and the second fuse block 12 distinguish whether an inputted address which has been decoded is the repair address or not by inputting an initiated signal wlcz, a decoding signal bax2<0:1> and a decoding signal bax01<0:3>. Here, the initiated signal wlcz is a signal for initializing the block selection circuit. And, when the external address is 3 bits, the decoding signal bax2<0:1> is a signal decoded higher 1 bit of the external address, and the decoding signal bax2<0:3> is a signal decoded lower 2 bits of the external address. As a result, the block is selected by the decoding signal bax2<0:1> and specific row word lines of the selected block are selected by the decoding signal bax01<0:3>. For instance, when a decoding signal bax2<0> is high level, an upper block is selected, and when a decoding signal bax2<1> is high level, a lower block is selected. Meanwhile, the decoding signal bax2<0> and the decoding signal bax2<1> are generated by decoding the higher 1 bit. Therefore, they may not become high level at the same time. Furthermore, when the input address is the repair address, the first fuse block 11 and the second fuse block 12 output decision signals xsRed_up, and xfsRed_dn of high level. When the input address is not the repair address, the first fuse block 11 and the second fuse block 12 output decision signals xsRed_up, and xfsRed_dn which are transited from high level to low level. The decision signals xfsRed_up, xfsRed_dn outputted from the first fuse block 11 and second fuse blocks 12 are respectively reversed by a first inverter I11 and a second inverter I12, and then become spare row enable signals sre_up, sre_dn. When the input address is identical to the repair address stored in the first fuse block 11 and the second fuse block 12, the spare row enable signals sre_up, sre_dn are respectively transited from low level to high level. The spare row enable signal sre_up, sre_dn are inputted in a NAND gate 13, and an output signal of the NAND gate 13 is reversed by a third inverter I13 and then becomes a normal row enable signal nre. As a result, when the input address is not the repair address, which means all the decision signals xfsRed_up, xfsRed_dn maintain low level, the normal row enable signal nre is transited from low level to high level. An upper spare row enable signal sre_up is delayed by a first delay unit 14, while a lower spare row enable signal sre_dn is delayed by a second delay unit 15. An upper block selector 16 defines level of an upper block selection signal bsz_up according to the decoding signal bax2<0>, the normal row enable signal nre, the spare row enable signal sre_dn delayed through the second delay unit 15, the initiated signal wlcz, and the decision signal xfsRed_up. On the other hand, a lower block selector 17 defines level of a lower block selection signal bsz_dn according to the decoding signal bax2<1>, the normal row enable signal nre, the upper spare row enable signal sre_up delayed through the first delay unit 14, the initiated signal wlcz, and the decision signal xfsRed_dn.

Figure 2:
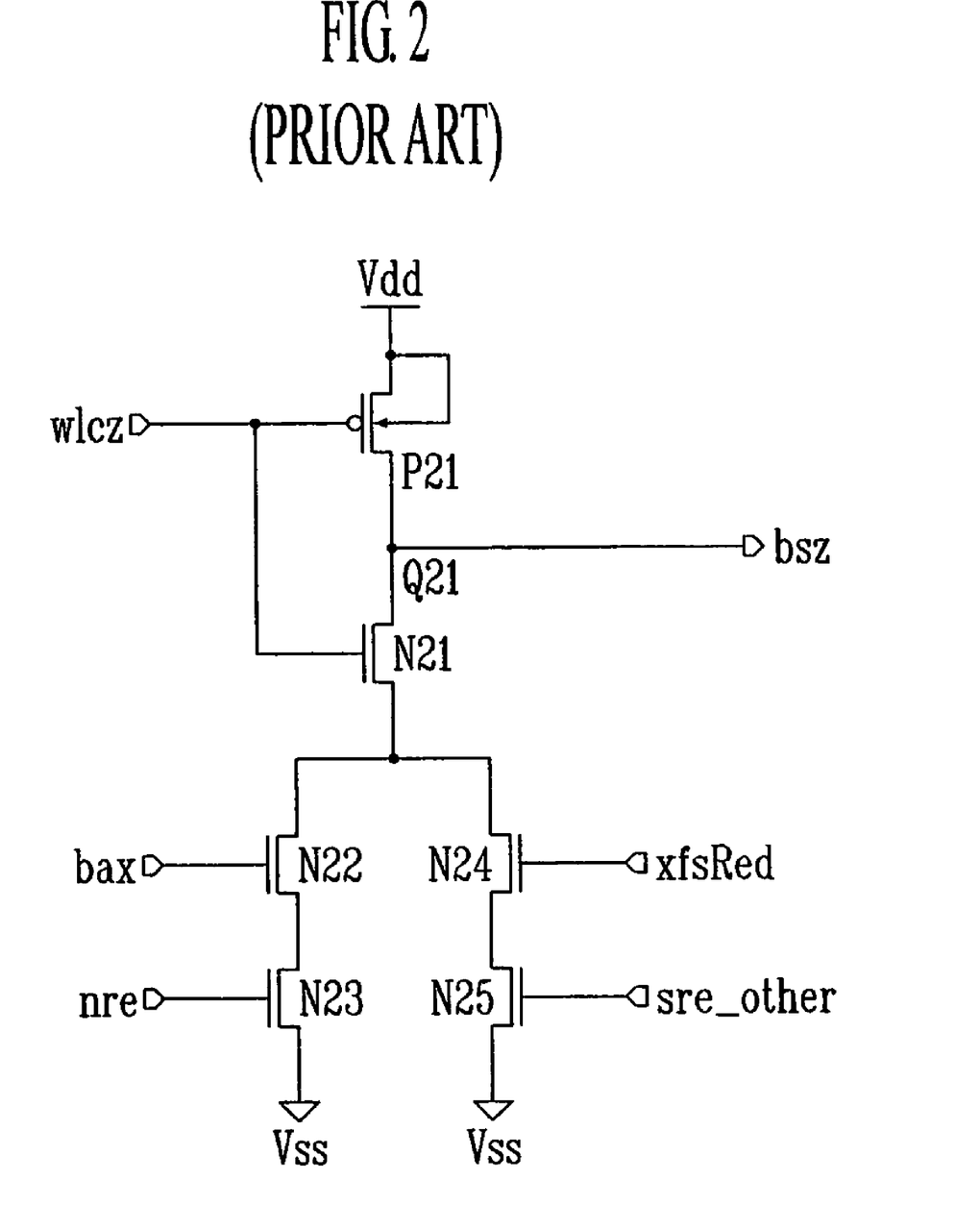
FIG. 2 is a circuit diagram illustrating a block selector included in the conventional block selection circuit.

As FIG. 2 is a circuit diagram illustrating a block selector of the conventional block selection circuit, an upper block selector and a lower block selector are composed as the same circuit, respectively.

A first PMOS transistor P21 is connected between a power source terminal Vdd and a first node Q21, which is driven according to the initiated signal wlcz. A first NMOS transistor N21 is connected between the first node Q21 and a second node Q22, which is driven according to the initiated signal wlcz. A second NMOS transistor N22 driven by a decoding signal bax and a third NMOS transistor N23 driven by a normal row enable signal nre are serially connected between the second node Q22 and a ground terminal Vss. A fourth NMOS transistor N24 driven by a decision signal xfsRed, which is outputted from the fuse block, and a fifth NMOS transistor N25 driven by another spare row enable signal sre_other are serially connected between the second node Q22 and the ground terminal Vss. However, the second NMOS transistor N22 and the third NMOS transistor N23 connected in series, and the fourth NMOS transistor N24 and the fifth NMOS transistor N25 connected in series are connected in parallel. Here, when a block selector is the upper block selector, the spare row enable signal sre_other is a lower spare row enable signal sre_dn. Contrarily, when the block selector is the lower block selector, the spare row enable signal sre_other is an upper spare row enable signal sre_up. Additionally, a potential of the first node Q21 becomes level of a block selection signal bsz.

An operation of a block selector comprised as aforementioned structure will be illustrated with reference to FIGS. 1 and 2 as follows.

As the first PMOS transistor P21 is turned on and the first NMOS transistor N21 is turned off in accordance with the initiated signal wlcz of low level, the first node Q21 maintains a potential of high level in an initial state. When the initiated signal wlcz is applied to high level, the first PMOS transistor P21 is turned off, and the first NMOS transistor N21 is turned on. Accordingly, a current path is decided by operations of the second NMOS transistor N22 and the third NMOS transistor N23 or the fourth NMOS transistor N24 and the fifth NMOS transistor N25, and thus the potential of the first node Q21 is decided thereby. The second NMOS transistor N22 is operated and also the block is selected by the decoding signal bax2<0:1> for selecting a block. Moreover, the third NMOS transistor is driven by the normal row enable signal nre. During this, when the repair address set according to fuse cutting states of the first and second fuse blocks 11, 12 is not identical to any of external addresses, the normal row enable signal nre is inputted to high level. When the repair address is identical to at least one of external addresses, the normal row enable signal nre is inputted to low level. Meanwhile, the fourth NMOS transistor N24 is driven by the decision signal xfsRed outputted from the fuse blocks 11, 12. During this, when an input address is the repair address, the decision signal xfsRed is inputted to high level, and inputted to low level when the input address is not the repair address. Furthermore, the fifth NMOS transistor N25 is driven by another spare row enable signal sre_other. During this, when the decision signal xfsRed is inputted to high level, a transition time of the block selection signal bsz is set to according to the transition time of another spare row enable signal sre_other. The current path through the second and third NMOS transistors N22, N23 is a current path in case that the normal block is selected, and the current path through the fourth and fifth NMOS transistors N24, N25 is a current path in case that the repair block is selected.

Figure 3A:
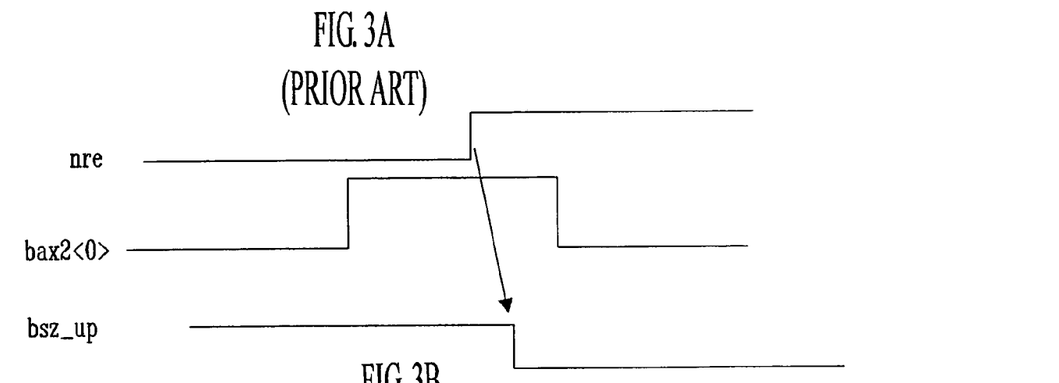
FIGS. 3A and 3B are waveform diagrams illustrating results when a normal block is selected by using the conventional block selection circuit.
Figure 3B:
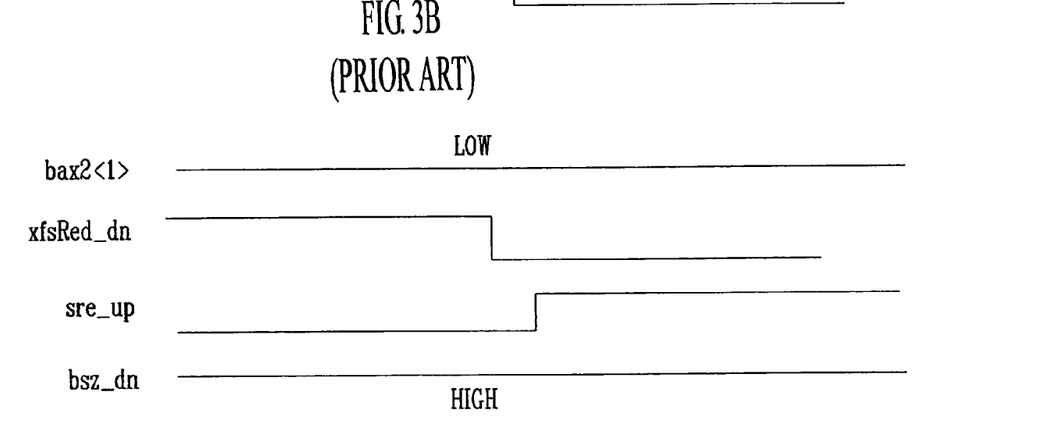

As FIGS. 3A and 3B are waveform diagrams illustrating results when a normal block is selected by using the conventional block selection circuit, FIG. 3A is a waveform diagram of the upper block selector when the upper block is selected by an external address, FIG. 3B is a waveform of the lower block selector at this time.

Referring to FIGS. 1, 2 and 3A, as the decoding signal bax2<0> is transited to high level in order to select the upper block, the second NMOS transistor N22 in the upper block selector is turned on. While this, because the normal row enable signal nre is transited to high level, the third NMOS transistor N23 is turned on. As a result, currents are passed through the second and third NMOS transistors N22, N23 and then the potential of the first node Q21 becomes low level, which potential, as an upper block selection signal bsz_up, selects the upper block.

Referring to FIGS. 1, 2, and 3B, because the decoding signal bax2<1> is applied to low level, the second NOMS transistor N22 in the lower block selector is turned off. Moreover, the decision signal xfsRed_dn outputted from the second fuse block 12 is applied to low level, turning off the fourth NMOS transistor N24, while the upper spare row enable signal sre_up is applied to low level, turning off the fifth NMOS transistor N25. Thereby, the lower block selection signal bsz_dn is outputted to high level and then the lower block is not selected.

However, if the specific row word lines set by the decoding signal bax2<0:1> and the decoding signal bax01<0:3> have defected and are replaced with redundancy word lines of another block, a position of the block decided by an external address doesn't make any meaning but a block address of the replaced redundancy word lines has an important meaning. When the external address is inputted to a word line of the lower block but the word line is replaced with the upper block redundancy word lines, the block selection circuit has to select the upper block according to an operation of the fuse block, however, in this case, the block selection circuit selects a block regardless of the decoding signal bax2<0:1>, which case will be described in FIGS. 4A and 4B.

Figure 4A:
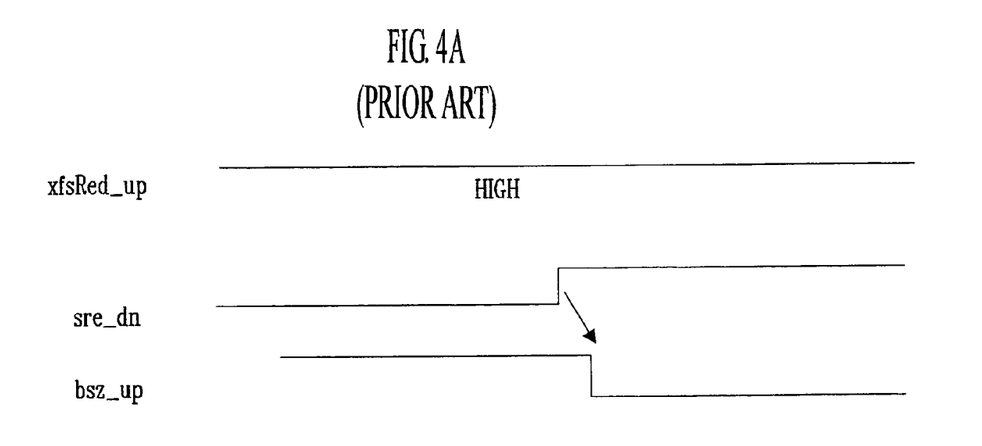
FIGS. 4A and 4B are waveform diagrams illustrating results when a repair block is selected by using the conventional block selection circuit.
Figure 4B:
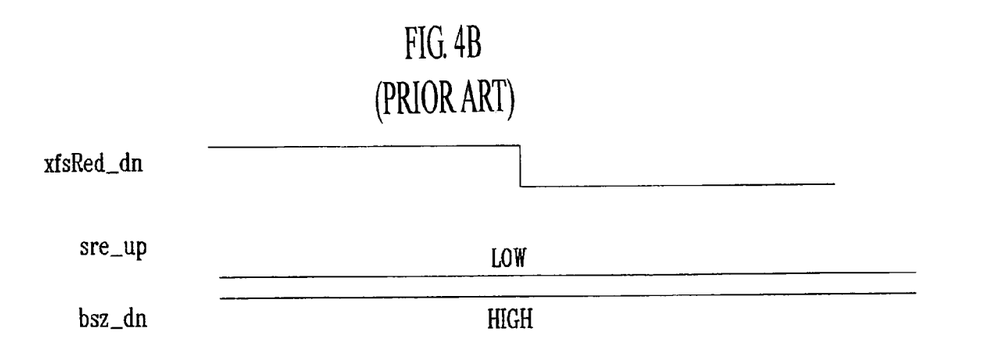

As FIGS. 4A and 4B are waveform diagrams illustrating results when a repair block is selected by using the conventional block selection circuit, FIG. 4A is a waveform diagram of the upper block selector in the case that the upper block is selected and FIG. 4B is a waveform of a lower block selector at this time.

Referring to FIGS. 1, 2, and 4A, because the input address is identical to the repair address, the normal row enable signal nre is applied to low level, turning off the third NMOS transistor N23. Furthermore, the decision signal xfsRed_up outputted from the first fuse block 11 is applied to high level, turning on the fourth NMOS transistor N24. During this, as the decision signal xfsRed_dn outputted from the second fuse block 12 is outputted to low level, the lower spare row enable signal sre_dn is applied to high level, turning on the fifth NMOS transistor N25. Accordingly, currents are passed through the fourth and fifth NMOS transistors N24, N25 and then a potential of the first node Q21 becomes low level, which potential, as the upper block selection signal bsz_up, selects the upper block.

Referring to FIGS. 1, 2, and 4B, because the input address is identical to the repair address, the normal row enable signal nre is applied to low level, turning off the third NMOS transistor N23. Also, the decision signal xfsRed_dn outputted from the second fuse block 12 is transited to low level, turning off the fourth NMOS transistor N24. While this, as the decision signal xfsRed_up outputted from the first fuse block 11 is applied to high level, the upper spare row enable signal sre_up is applied to low level, turning off the fifth NMOS transistor N25. As a result, the first node Q21, as a selection signal bsz_dn of the lower block, is outputted to high level.

Figure 5A:
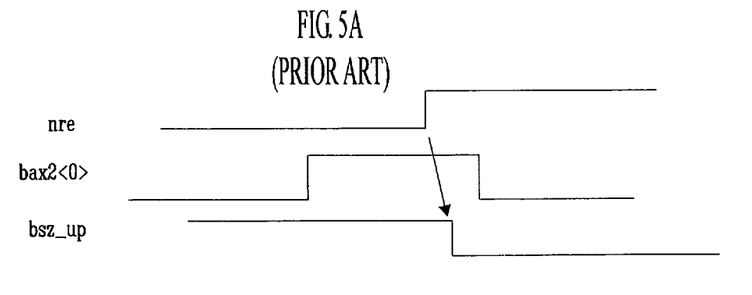
FIGS. 5A and 5B are waveform diagrams illustrating results when a normal block is selected to explain the reason why delay units included in the conventional block selection circuit are necessary.
Figure 5B:
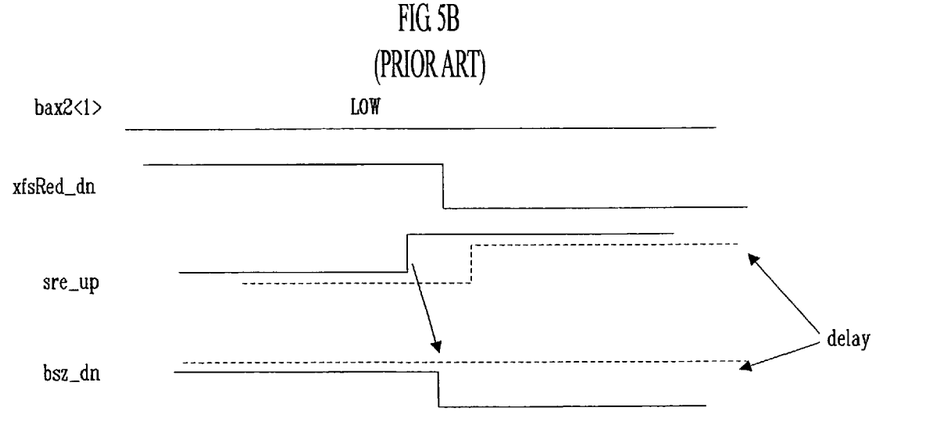

As FIGS. 5A and 5B are waveform diagrams explaining the reason why delay units to delay a spare row enable signal sre are necessary in the conventional block selection circuit, with which illustrates waveform diagrams in the case that the normal block is selected by using FIGS. 3A and 3B When a signal selecting the upper block is inputted, the upper block selector normally operates. However, the decision signals xfsRed outputted from the fuse block 11, 12 are outputted with different speed, respectively, according to the input address. For instance, when the decision signal xfsRed_dn outputted from the second fuse block 12 is transited to low level later, and the decision signal xfsRed_up outputted from the first fuse block 11 transits to high level earlier, both the upper spare row enable signal sre_up, and the decision signal xfsRed_dn outputted from the second fuse block 12 all become high level, and thus the lower block selection signal bsz_dn is transited to low level as shown in FIG. 5. In this case, however, both the upper and lower blocks are selected. Therefore, the conventional block selection circuit should comprise a first delay unit 14 and a second delay unit 15 which delay the spare row enable signal sre, in order to prevent defect caused due to the difference of outputting speeds of decision signals xfsRed outputted from the first and second fuse blocks 11, 12. However, these delay units degrades an operating speed of the block selection circuit.

As a result, as blocks are selected by using the decision signals xfsRed which depends on the external address, delay units are necessary to compensate outputting speeds of the decision signals xfsRed in the conventional block selection circuit. The delay units cause degradation of the operating speed of the block selection circuit. As well, in order to set a delay time by a simulation, differences should be detected between a decision signal outputted from the rapidest fuse block and another decision signal outputted from the slowest fuse block, in all the case of addresses. Furthermore, because variations of a process, a temperature, and a power source voltage have different influences on output signals of fuse blocks and on a delay circuit, an additional delay time should be considered for circuit designing and it also degrades the operation speed of the block selection circuit.

SUMMARY OF THE INVENTION

The present invention is directed to a block selection circuit capable of solving those aforementioned problems by removing delay units which delay a spare row enable signal.

One aspect of the present invention is to provide a block selection circuit capable of solving those aforementioned problems by including a reference fuse block which generates a reference signal independent on an external address, in order to output a spare row enable signal later than decision signals outputted from fuse blocks.

Another aspect of the present invention is to provide a block selection circuit capable of solving those aforementioned problems by outputting a spare row enable signal and a normal row enable signal more speedily and simply.

Here, the block selection circuit in accordance with the present invention includes: a plurality of fuse blocks for storing a repair information, and outputting decision signals according to results of comparing with the repair information by inputting first and second coding signals; a reference block for generating a reference signal outputted later than or at the same time to the decision signals which are outputted from each of the fuse blocks; a first signal generator for generating a first signal with combining the decision signals outputted from each of the fuse blocks; a second signals generator for generating a second signal later than the decision signals in accordance with the reference signal outputted from the reference block; and a plurality of block selectors for outputting selection signals to select a normal block or a redundancy block in accordance with the first address coding signal, the decision signals, and the first and second signals The reference fuse block includes a fuse capable of programming, which copies the fuse blocks in case that the decision signal is outputted the latest among outputting speeds of the decision signals which are outputted from the fuse blocks.

The block selection circuit in accordance with another embodiment of the present invention includes a plurality of fuse blocks for storing a repair information, and for outputting decision signals according to results of comparing with the repair information by inputting first and second address coding signals; a reference block for generating a reference signal by a constant time regardless of the decision signals outputted from each of the fuse blocks; a first signal generator for generating a first signal with combining the decision signals outputted each of the fuse blocks; a second signal generator for generating a second signal late than the decision signals in accordance with the reference signal outputted from the reference block; and a plurality of block selectors for outputting a selection signal to select a normal block or a redundancy block in accordance with the first address coding signal, the decision signals, and the first and second signals.

The fuse blocks include a plurality of fuses capable of programming, which store the repair information according to programming states of the fuses.

The fuse blocks includes a PMOS transistor to set initial levels of the decision signals by being driven according to an initiated signal; a plurality of fuses connected each other in parallel, capable of programming; and a plurality of NMOS transistors serially connected to a plurality of fuses, respectively, and driven by the first and second address coding signals. Levels of the decision signals are set to in accordance with programming states of the fuses and driving of the NMOS transistors.

The first signal generator includes a plurality of NOR gates for inputting the decision signals outputted from the two adjacent fuse blocks, and a NAND gate for outputting the first signal in response to inputting output signals of a plurality of NOR gates.

The second signal generator includes an inverter for outputting the second signal by reversing the reference signal outputted from the reference block.

The block selectors are composed of a first switch for setting an initial level of the selection signal in accordance with the initiated signal, a second switch for setting level of the selection signal when the normal block is selected according to the initiated signal, the first address coding signal, and the first signal, and a third switch for setting level of the selection signal when the redundancy block is selected according to the initiated signal, the decision signals, and the second signal.

The first switch is a PMOS transistor driven by the initiated signal, being connected between a power source terminal and an output terminal of the selection signal.

The second switch includes first through third NMOS transistors connected between the output terminal of the selection signal and a ground terminal in series, of which the first NMOS transistor is driven by the initiated signal, the second NMOS transistor is driven by the first address coding signal, and the third NMOS transistor is driven by the first signal.

The third switch includes first through third NMOS transistors connected between the output terminal of the selection signal and the ground terminal in series, of which the first NMOS transistor is driven by the initiated signal, the second NMOS transistor is driven by the decision signals, and the third NMOS transistor is driven by the second signal.

BRIEF DESCRIPTION OF THE DRAWINGS

A more complete understanding of the present invention may be had by reference to the following description when taken in conjunction with the accompanying drawings in which.

DETAILED DESCRIPTION OF PREFERRED EMBODIMENTS

Hereinafter, it will be described about embodiments of the present invention with reference to drawings in detail.

Figure 6:
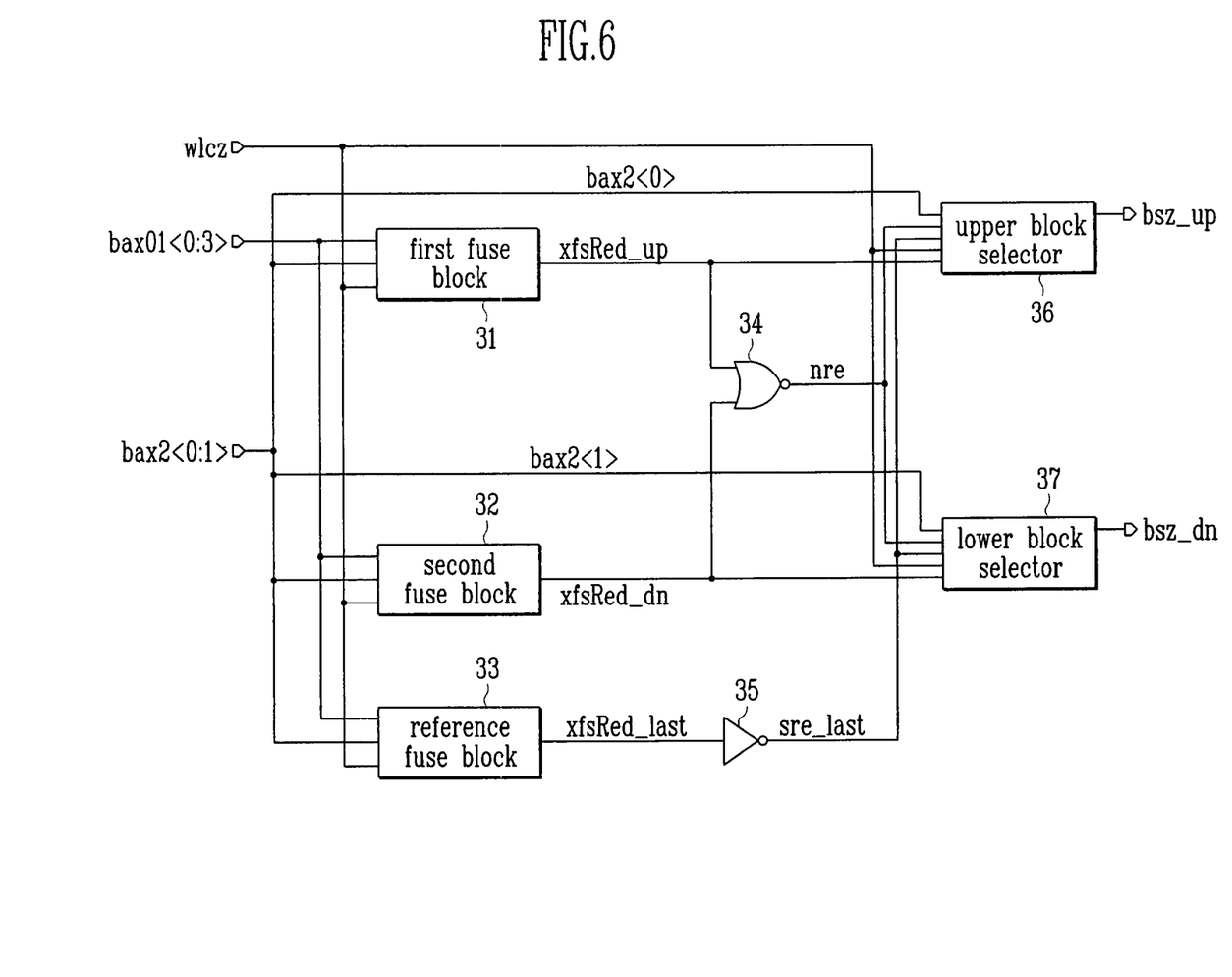
FIG. 6 is a circuit diagram of a block selection circuit in accordance with an explanatory embodiment of the present invention.

FIG. 6 is a circuit diagram of a block selection circuit in accordance with an explanatory embodiment of the present invention. The block selection circuit in FIG. 6 removes an inverter which generates a spare row enable signal by reversing a decision signal outputted from a fuse block, and delay units which delay the spare row enable signal away from the conventional block selection circuit. The inverter outputs the spare row enable signal later than the decision signal. Thus, a reference signal is available to be generated in the identical time to the decision signal by means of an additional inverter.

As described in FIG. 6, a first fuse block 31 and a second fuse block 32 are composed of a plurality of fuses capable of programming, respectively. By storing a repair address information according to fuse cutting states, which means programming states of fuses, the two fuse blocks distinguish whether an address inputted by being decoded is a repair address or not, in response to inputting an initiated signal wlcz, a decoding signal bax2<0:1>, and a decoding signal bax01<0:3>. Here, the initiated signal wlcz initializes the block selection circuit. And, when an external address is 3 bits, the decoding signal bax2<0:1> decodes higher 1 bit of the external address while the decoding signal bax01<0:3> decodes lower 2 bits of the external address. During this, a block is selected by the decoding signal bax2<0:1>, and a specific row word line of the selected block is selected by the decoding signal bax01<0:3>. For instance, when the decoding signal bax2<0> is high level, an upper block is selected, and when the decoding signal bax2<1> is high level, a lower block is selected. On the other hand, because the decoding signal bax2<0> and the decoding signal bax2<1> are results of decoding higher 1 bit, those signals may not be high level at the same time. Moreover, when an input signal is the repair address, the first fuse block 31 and the second fuse block 32 output a decision signal xfsRed of high level, but when the input address isn't the repair address, the first fuse block 31 and the second fuse block 32 output a decision xfsRed which is transited from high level to low level. The decision signal xfsRed_up outputted from the first fuse block 31 and the decision signal xfsRed_dn outputted from the second fuse block 32 are both inputted to a NOR gate 34. When the input address isn't the repair address which means the decision signals xfsRed_up and xfsRed_dn maintain low level, the NOR gate 34 outputs a normal row enable signal nre of high level. In other words, when one of the input addresses is the repair address which means one of the decision signals xfsRed_up and xfsRed_dn maintains high level, the NOR gate 34 outputs a normal row enable signal nre of low level. A reference fuse block 33 is composed to output a reference signal xfsRed_last later than or at the same time to the decision signals xfsRed_up and xfsRed_dn outputted from the first fuse block 31 and the second fuse block 32, and then it makes the block selection circuit normally operated without any defect. To make it possible, the reference fuse block 33 should be composed to output the reference signal xfsRed_last whenever the external address is inputted. As outputting speeds of the decision signals xfsRed_up and kfsRed_dn outputted from the first fuse block 31 and the second fuse block 32 are set to by the input address and fuse cutting states, the address and the fuse cutting states can be seen in the case of being generated the slowest through a simulation. Thus, the reference fuse block 33 copies a fuse block in the case that the decision signal xfsRed is outputted the slowest. Contrarily, the reference fuse block 33 is available to be composed to output the reference signal xfsRed_last by a constant delay time regardless of other fuse blocks. It should be guaranteed for a spare row enable signal sre_last to be outputted later than the decision signal xfsRed, considering an arrangement and routing of a circuit. An inverter 35 reverses the reference signal xfsRed_last outputted from the reference fuse block 33, and then outputs the spare row enable signal sre_last later than the decision signal xfsRed. Here, the spare row enable signal sre_last is inputted to an upper block selector 36 and a lower block selector 37. The upper block selector 36 determines level of an upper row enable signal bsz_up in accordance with the decoding signal bax2<0>, the normal row enable signal nre, the spare row enable signal sre_last, the initiated signal wlcz, and the decision signal xfsRed_up. The lower block selector 37 determines level of a lower block selection signal bsz_dn in accordance with the decoding signal bax2<1>, the normal row enable signal nre, the spare row enable signal sre_last, the initiated signal wlcz, and the decision signal xfsRed_dn.

Figure 7:
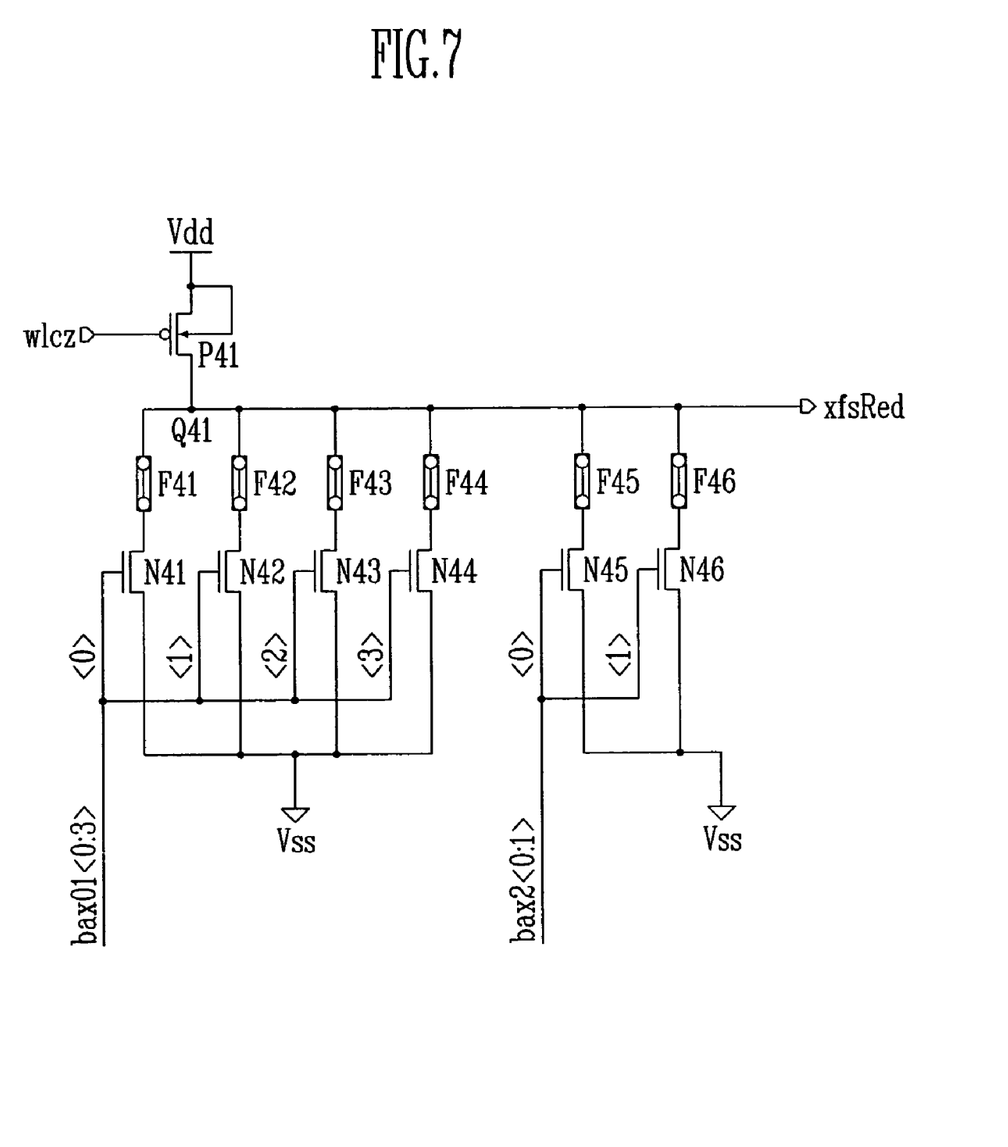
FIG. 7 is a circuit diagram illustrating an embodiment of a fuse block included in the block selection circuit in accordance with an explanatory embodiment of the present invention.

FIG. 7 is a circuit diagram illustrating an embodiment of fuse blocks included in the block selection circuit in accordance with an explanatory embodiment of the present invention.

A first PMOS transistor P41 driven by the initiated signal wlcz is connected between a power source terminal Vdd and a first node Q41. A plurality of fuses F41~F46 and a plurality of NMOS transistors N41~N46 are respectively connected in parallel between the first node Q41 and a ground terminal Vss. Moreover, each of fuses F41~F46 and each of NMOS transistors are connected in series. That is, a first fuse F41 and a first NMOS transistor N41 driven by a decoding signal bax01<0> are connected between the first node Q41 and the ground terminal Vss in series. A second fuse F42 and a second NMOS transistor N42 driven by a decoding signal bax01<1> are connected between the first node Q41 and the ground terminal Vss in series. A third fuse F43 and a third NMOS transistor N43 driven by a decoding signal bax01<2> are connected between the first node Q41 and the ground terminal Vss in series. A fourth fuse F44 and a fourth NMOS transistor N44 driven by a decoding signal bax01<3> are serially connected between the first node Q41 and the ground terminal Vss. Further, a fifth fuse F45 and a fifth NMOS transistor N45 driven by a decoding signal bax2<0> are serially connected between the first node Q41 and the ground terminal Vss, and a sixth fuse F46 and a sixth NMOS transistor N46 driven by a decoding signal bax2<1> are serially connected between the first node Q41 and the ground terminal Vss. Meanwhile, a potential of the first node Q41 is outputted as the decision signal xfsRed.

The fuse block composed as aforementioned turns on the PMOS transistor P41 by the initiated signal wlcz of low level in the initial state. Then, the first node Q41 is precharged to high level, thereby, outputting the decision signal xfsRed of high level. When the decoding signal bax2<0:1> and the decoding signal bax01<0:3> are inputted in this initial state, the NMOS transistors N41~N46 are alternatively turned on. As a result, currents are discharged through the fuses F41~F46 and the NMOS transistors N41~N46 and then the decision signal xfsRed is transited to low level.

Figure 8:
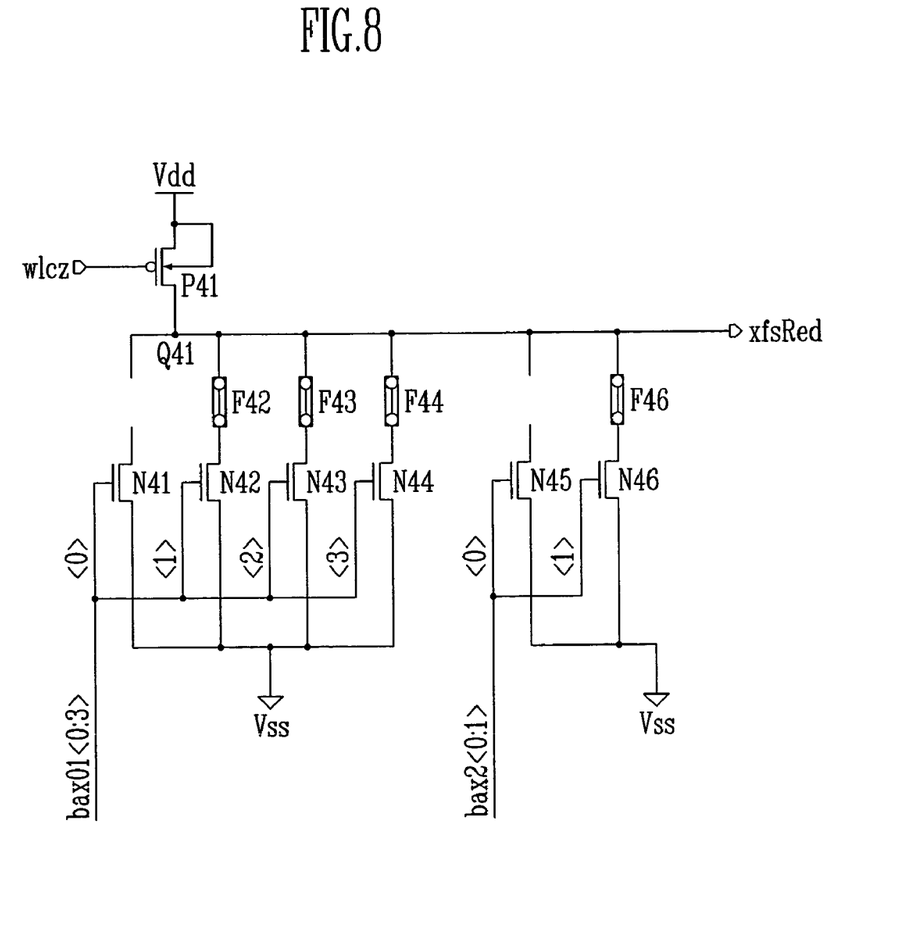
FIG. 8 is a circuit diagram illustrating a condition of a cut fuse of fuse block which comprises the block selection circuit in accordance with an embodiment of the present invention.
Figure 9:
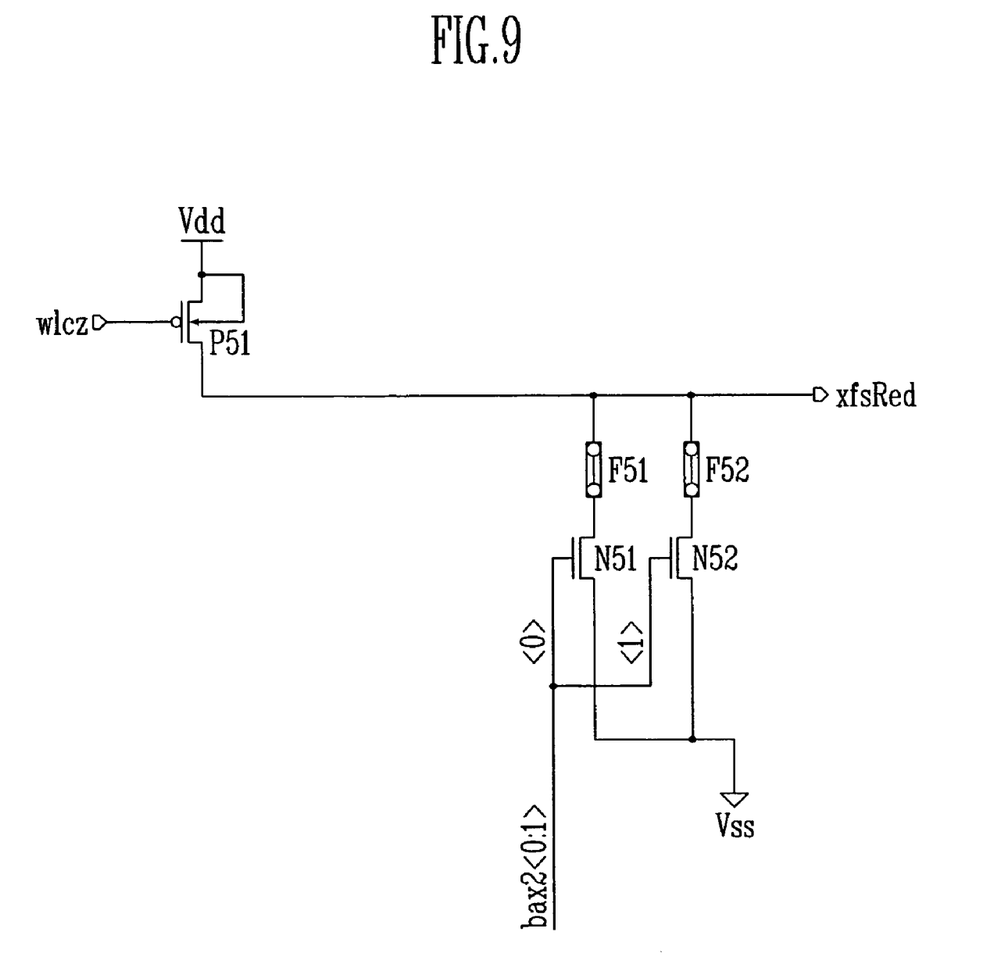
FIG. 9 is a circuit diagram illustrating an embodiment of a reference fuse block which comprises the block selection circuit in accordance with an embodiment of the present invention.

As FIG. 8 is a circuit diagram illustrating fuse cutting states of fuse block described with reference to FIG. 7, it shows fuse blocks which fuses are cut off for a repair address bax=000, that is, the decoding signal bax2<0> and the decoding signal bax01<0>. In this case, when the external address is bax=000, which means the decoding signal bax01<0> is high level, the decision signal xfsRed represents an address repaired by maintaining high level, because the external address is not discharged through the NMOS transistors. Furthermore, a transition time of the decision signal xfsRed becomes different according to the external address in the fuse cutting states. Thus, it will be compared a case of bax=100 with a case of bax=101. The decoding signal bax2<1> and the decoding signal bax01<0> get to high level in the case of bax=100, but currents are discharged only through the sixth NMOS transistor N46 arranged to the decoding signal bax2<1>. However, because the decoding signal bax2<1> and the decoding signal bax01<1> are high level in the case of bax=101, currents are discharged through the second NMOS transistor N42 and the sixth NMOS transistor N46. Accordingly, it gets faster to transit the decision signal xfsRed from high level to low level. When cutting off two fuse blocks from FIG. 7, as can be seen in FIG. 8, considering all the combination of the external address, the latest transited decision signal xfsRed is discharged through merely one NMOS transistor. Therefore, a reference fuse block is available to be comprised as shown in FIG. 9. The decoding signal bax2<0> and the decoding signal bax2<1> which have decoded high significant bit of the external address can not be high level at the same time. Also, only one of the two signals becomes high level, so that currents are discharged through only one NMOS transistor. The decision signal xfsRed is transited from high level to low level by an external decoding signal bax at any time and is discharged through always one NMOS transistor. Accordingly, a condition of the reference fuse block is satisfied by making the reference signal xfsRed_last the slowest output signal. In addition, it is an additional advantage from the present invention that the normal row enable signal nre generates the decision signal xfsRed_up outputted from the first fuse block 31 and the output signal xfsRed_dn from the second fuse block 32, by using the NOR gate 34.

FIG. 9 is a circuit diagram illustrating an embodiment of a reference fuse block which comprises the block selection circuit in accordance with an embodiment of the present invention.

Referring to FIG. 9, a PMOS transistor P51 driven by the initiated signal wlcz is connected between the power source terminal Vdd and a first node Q51. A first fuse F51 and a first NMOS transistor N51 driven by the decoding signal bax2<0> are connected in series between the first node Q51 and the ground terminal Vss, and a second fuse F52 and a second NMOS transistor N52 driven by the decoding signal bax2<1> are connected in series between the first node Q51 and the ground terminal Vss. The first fuse F51 and the first NMOS transistor N51 connected in series and the second fuse F52 and the second NMOS transistor N52 connected in series are connected in parallel each other. A potential of the first node Q51 becomes level of the reference signal xfsRed_last.

On the other hand, the reference fuse block is available to be comprised by means of combining a transistor, a resistor, a fuse, and a capacitor in order to take a constant signal delay time.

Figure 10:
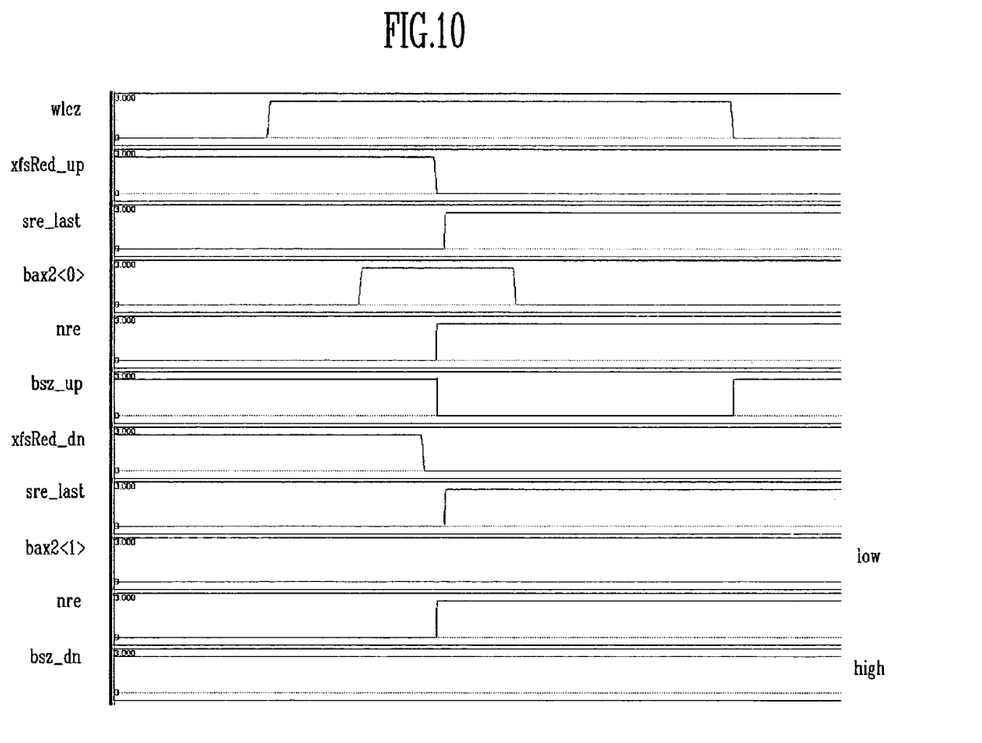
FIG. 10 is a waveform diagram illustrating results when a normal block is selected by using the block selection circuit in accordance with an embodiment of the present invention.

FIG. 10 is a waveform diagram illustrating results when a normal block is selected by using the block selection circuit in accordance with an embodiment of the present invention.

When the reference signal xfsRed_last is outputted later than or at the same time to the decision signals xfsRed_up and xfsRed-dn, and the normal word line of the upper block is selected as the decoding signal bax2<0> of high level, the upper block selection signal bsz_up is outputted to low level and the lower block selection signal bsz_dn is outputted to high level, thereby operating normally.

Figure 11:
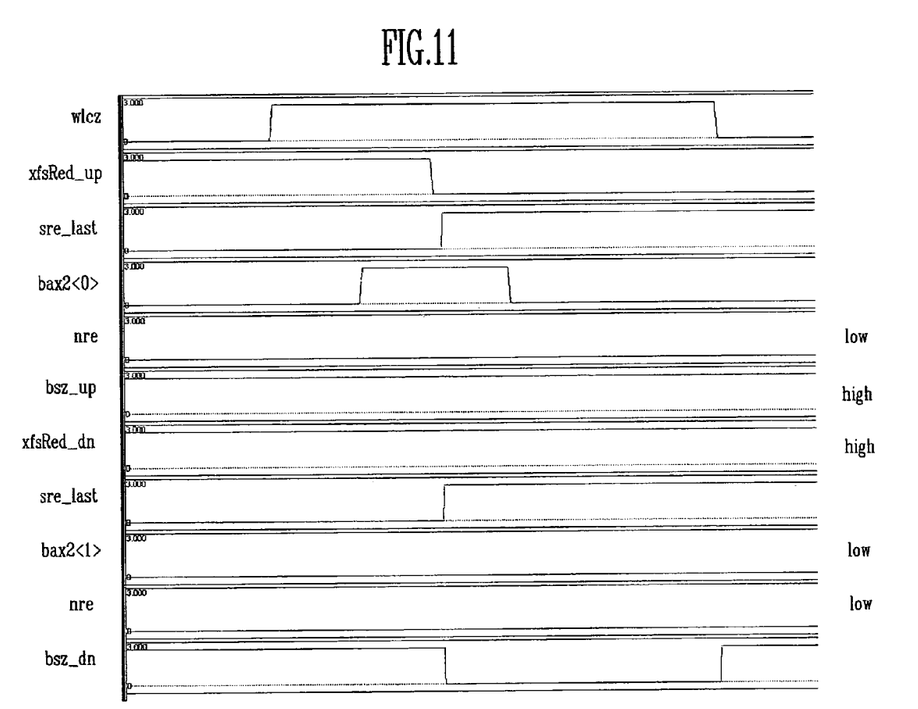
FIG. 11 is a waveform diagram illustrating results when a repair block is selected by using the block selection circuit in accordance with an embodiment of the present invention.

FIG. 11 is a waveform diagram illustrating results when a repair block is selected by using the block selection circuit in accordance with an embodiment of the present invention. FIG. 11 describes about the case that the external address selects the upper block by applying the decoding signal bax2<0> to high level, but the row word lines are replaced with the redundancy word line of lower block.

As shown in FIG. 11, as the normal row enable signal nre is low level, the upper block selection signal nre maintains high level, the decision signal xfsRed_dn is high level, and the lower block selection signal bsz_dn is transited to low level. As a result, all the signal performs a normal operation.

Figure 12:
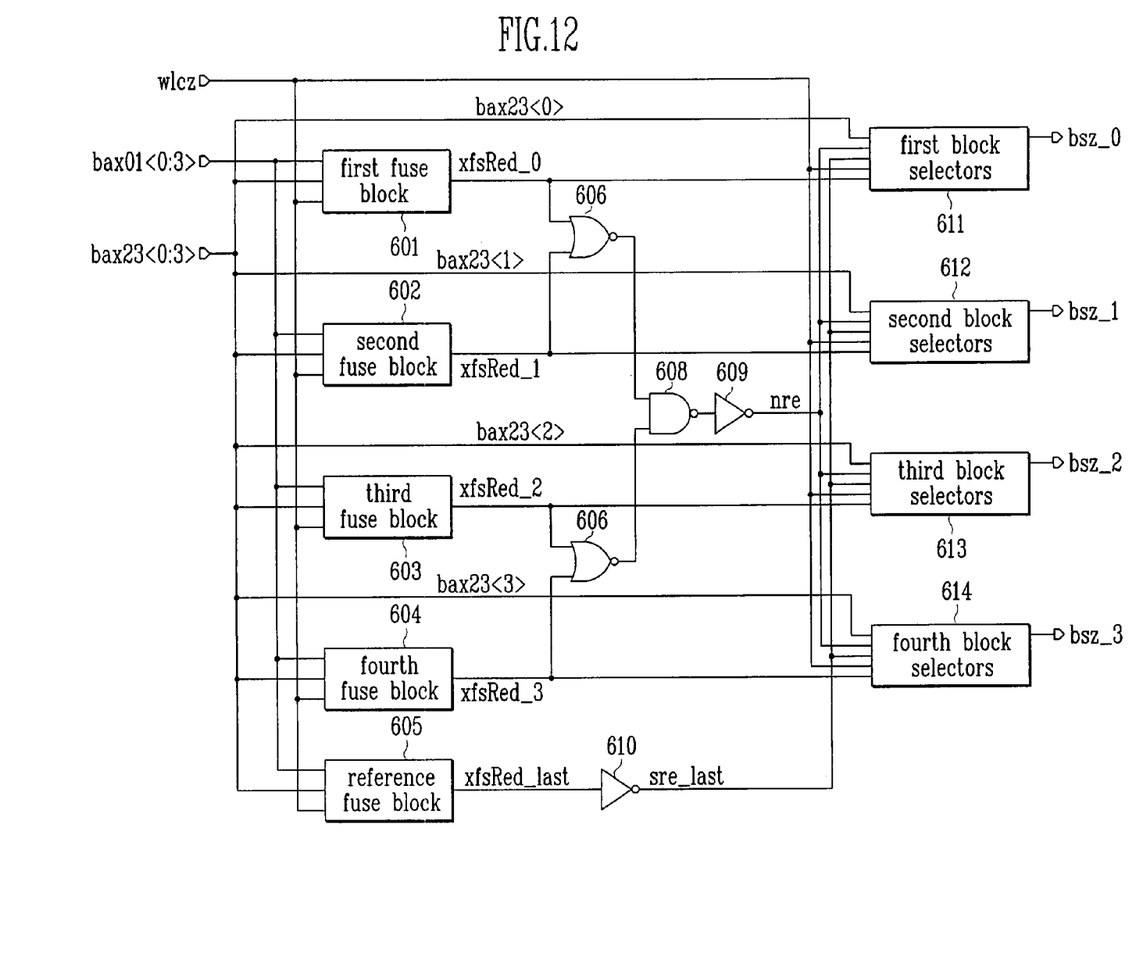
FIG. 12 is a block selection circuit in accordance with another explanatory embodiment of the present invention.

As FIG. 12 is a circuit diagram of the block selection circuit in accordance with another embodiment of the present invention, one redundancy word line is set to for each four blocks. As an external address is 4 bit, a decoding signal bax23<0:3> decodes higher 2 bit of the external address, and a decoding signal bax01<0:3> decodes lower 2 bit of the external address. Accordingly, the structure of the NOR gate is merely variable by increase of the number of blocks, the reference signal xfsRed_last outputted from the reference fuse block 605 is reversed by an inverter 610, and then the spare row enable signal sre_last generated thereby may be comprised in a common signal. Although the number of blocks and the number of redundancy row word lines of each block are increased, the circuit is available to consist of by using the spare row enable signal sre_last. Further, as more than one reference fuse block is arranged for convenience of routing or arrangement, the circuit may be advantageous for its performance if each spare row enable signal sre_last controls plural numbers of blocks.

Referring to FIG. 12, first through fourth fuse blocks 601~604 are comprised of a plurality of fuse, capable of programming, respectively. By storing the repair address information according to fuse cutting state which means programming states of fuses, the four fuse blocks distinguish whether an address inputted by being decoded is the repair address or not, in response to inputting the initiated signal wlcz, the decoding signal bax23<0:3> and the decoding signal bax01<0:3>. The reference fuse block 605 is composed to output the reference signal xfsRed_last later than or at the same time to decision signals xfsRed_0 to xfsRed_3 which are outputted from the first through fourth fuse blocks 601~604, from which leads the block selection circuit to be normally operated without any defect. The decision signal xfsRed_0 outputted from the first fuse block 601 and the decision signal xfsRed_1 outputted from the second fuse block 602 are inputted to a first NOR gate 606. The decision signal xfsRed_2 outputted from the third fuse block 603 and the decision signal xfsRed_3 outputted from the fourth fuse block 604 are inputted to a second NOR gate 607. Output signals of the first and second NOR gates 606 and 607 are inputted to a NAND gate 608, and an output signal of the NAND gate 608 is reversed by a first inverter 609 to become the normal row enable signal nre. The reference signal xfsRed_last outputted from the reference fuse block 605 is reversed by a second inverter 610, thereby generating the spare row enable signal sre_last later than the decision signal xfsRed. First through fourth block selectors 611~614 set levels of first to fourth block selection signals bsz_0 to bsz_3 according to the decoding signal bax23<0:3>, the normal row enable signal nre, the spare row enable signal sre_last, the initiated signal wlcz, and the decision signals xfsRed_0 to xfsRed_3.

As aforementioned, according to the present invention, the reference fuse block is available to be composed independent on the external address to output the reference signal later than or at the same time to the decision signals which are outputted from fuse blocks, and the spare row enable signal is generated later than the decision signals by using the reference signal. As a result, the delay units are removed therefrom and the speed of the block selection circuit is able to be improved thereby. Moreover, the conventional block selection circuit should set a delay time, considering both cases of the decision signals being outputted fast and being outputted slow. Contrarily, the block selection circuit in accordance with the present invention is possible to consider only the case of the decision signals being outputted slowly. Furthermore, in the condition that the reference fuse block is composed by copying the basic of the conventional fuse blocks, although the outputting speeds of the decision signals from the fuse blocks are changeable according to a process, a temperature, a driving voltage, and so on, an operation stability can be assured because the reference fuse block is changeable as well. Meanwhile, a fixed generating position of the spare row enable signal is advantageous to setting a timing margin of a relative circuit.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A block selection circuit, comprising:
    a plurality of fuse blocks for storing repair information and outputting decision signals according to results of comparing the repair information with first and second address coding signals;
    a reference block for generating a reference signal which is outputted later than or at the same time as the decision signals outputted from each of the fuse blocks;
    a first signal generator for generating a first signal by combining the decision signals outputted from each of the fuse blocks;
    a second signal generator for generating a second signal later than the decision signals according to the reference signal outputted from the reference block; and
    a plurality of block selectors for outputting a selection signal which selects a normal block or a redundancy block in accordance with the first address coding signal, the decision signals, and the first and second signals.

2. The block selection circuit of claim 1, wherein the reference fuse block includes fuses capable of being programmed, and outputs the reference signal together with the decision signal.

3. A block selection circuit, comprising:
    a plurality of fuse blocks for storing repair information and outputting decision signals according to results of comparing the repair information with first and second address coding signals;
    a reference block for generating a reference signal with a given delay time;
    a first signal generator for generating a first signal by combining the decision signals outputted from each of the fuse blocks;
    a second signal generator for generating a second signal later than the decision signals according to the reference signal outputted from the reference block; and
    a plurality of block selectors for outputting a selection signal which selects a normal block or a redundancy block in accordance with the first address coding signal, the decision signals, and the first and second signals.

4. The block selection circuit of claim 3, wherein the fuse blocks include a plurality of fuses capable of being programmed, and store the repair information in accordance with programming states of the fuses.

5. The block selection circuit of claim 3, wherein each of the fuse blocks includes:
    a PMOS transistor for setting initial levels of the decision signals according to an initiated signal;
    a plurality of fuses capable of being programmed being connected in parallel with each other; and
    a plurality of NMOS transistors serially connected with the plurality of fuses, and driven by the first and second address coding signals;
    wherein levels of the decision signals are set according to programming states and driving states of the NMOS transistors.

6. The block selection circuit of claim 3, wherein the first signal generator includes:
    a plurality of NOR gates for receiving the decision signals which are outputted from two adjacent fuse blocks; and
    a NAND gate for outputting the first signal in response to receiving output signals of the plurality of NOR gates.

7. The block selection circuit of claim 3, wherein the second signal generator includes inverters for inverting the reference signal which is outputted from the reference block and then outputting the second signal.

8. The block selection circuit of claim 3, wherein the block selectors include:
    a first switch for setting a first level of the selection signal according to an initiated signal;
    a second switch for setting a second level of the selection signal when the normal block is selected in accordance with the first address coding signal and the first signal; and a third switch for setting a third level of the selection signal when the redundancy block is selected in accordance with the decision signals and the second signal.

9. The block selection circuit of claim 8, wherein the first switch is a PMOS transistor which is connected between a power source terminal and an output terminal of the block selector.

10. The block selection circuit of claim 8, wherein the second switch includes first through third NMOS transistors connected in series between the output terminal of the block selector and a ground terminal, wherein the first NMOS transistor is operated by the initiated signal, the second NMOS transistor is operated by the first address coding signal, and the third NMOS transistor is operated by the first signal.

11. The block selection circuit of claim 8, wherein the third switch includes first through third NMOS transistors connected in series between the output terminal of the block selector and the ground terminal, wherein the first NMOS transistor is operated by the initiated signal, the second NMOS transistor is operated by the decision signals, and the third NMOS transistor is operated by the second signal.

* * * * *